(12) United States Patent
Nakagawa

(10) Patent No.: US 8,168,978 B2
(45) Date of Patent: May 1, 2012

(54) DISPLAY DEVICE

(75) Inventor: Hideki Nakagawa, Chiba (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 208 days.

(21) Appl. No.: 12/757,169

(22) Filed: Apr. 9, 2010

(65) Prior Publication Data

US 2010/0258807 A1 Oct. 14, 2010

(30) Foreign Application Priority Data

Apr. 10, 2009 (JP) ................................. 2009-095668

(51) Int. Cl.
*H01L 33/00* (2010.01)
(52) U.S. Cl. ...................... 257/59; 257/72; 257/E33.053
(58) Field of Classification Search .................... 257/59, 257/72, E33.053
See application file for complete search history.

(56) References Cited

U.S. PATENT DOCUMENTS

| | | | |
|---|---|---|---|
| 7,319,239 B2 * | 1/2008 | Tsubata et al. .................. | 257/72 |
| 8,013,338 B2 * | 9/2011 | Kobayashi et al. ............. | 257/59 |
| 8,022,405 B2 * | 9/2011 | Yamazaki ........................ | 257/59 |
| 8,030,655 B2 * | 10/2011 | Yamazaki ........................ | 257/67 |
| 2009/0085038 A1 * | 4/2009 | Tsubata et al. .................. | 257/72 |
| 2011/0278577 A1 * | 11/2011 | Yamazaki ........................ | 257/59 |
| 2011/0303919 A1 * | 12/2011 | Kobayashi et al. ............. | 257/59 |

FOREIGN PATENT DOCUMENTS

JP 2005-167051 6/2005

* cited by examiner

*Primary Examiner* — Victor A Mandala
(74) *Attorney, Agent, or Firm* — Antonelli, Terry, Stout & Kraus, LLP.

(57) ABSTRACT

The present invention provides a display device where thin film transistors are formed on a substrate on which an image display portion is formed, wherein the thin film transistors comprise: a gate electrode; a gate insulating film formed so as to cover the gate electrode; a semiconductor layer in island form which is formed on the gate insulating film so as to overlap with the gate electrode; and a pair of electrodes formed on the semiconductor layer so as to face each other, and the semiconductor layer is provided within a region where the gate electrode is formed as viewed in a plane, and formed of a crystal semiconductor layer and an amorphous semiconductor layer, which are layered in sequence on the gate electrode side, characterized in that the gate electrode is formed so as to have such a film thickness that the light transmittance is 0.3% or less at least in the region facing the semiconductor layer.

10 Claims, 7 Drawing Sheets

DISPLAY DEVICE

CROSS-REFERENCE TO RELATED APPLICATION

The present application claims priority over Japanese Application JP2009-095668 filed on Apr. 10, 2009, the contents of which are hereby incorporated into this application by reference.

BACKGROUND OF THE INVENTION

1. Field of the Invention

The present invention relates to a display device, and in particular, to a display device where thin film transistors are formed on a substrate having a display portion.

2. Description of the Related Art

Liquid crystal display devices (panels) have a pair of substrates, which are positioned so as to face each other and sandwich liquid crystal in between as a housing, and have an image display portion formed of a large number of pixels that are aligned in a matrix with the liquid crystal as one component.

In addition, the pixels in the image display portion are usually driven in accordance with a so-called active matrix method. That is to say, pixel groups formed of a number of pixels aligned in the direction of rows are selected in sequence, and in accordance with the timing for this selection, a video signal is supplied through the drain signal line connected to all of the pixels aligned in the direction of columns. In this case, each selection of a pixel group is made by turning on the thin film transistors formed in the pixels that form the pixel group through a scan signal supplied through the gate signal line connected to all of the thin film transistors.

It is widely known that these liquid crystal display devices are provided with a scan signal driving circuit for supplying a scan signal to the gate signal lines, and a video signal driving circuit for supplying a video signal to the drain signal lines formed around the periphery of the above described image display portion on the substrate where the video display portion is formed, as well as a great number of thin film transistors in the respective driving circuits formed at the same time as the above described thin film transistors within the pixels.

These thin film transistors have a so-called MIS (metal insulator semiconductor) structure, and a so-called bottom gate type, where the thin film transistor is formed on the surface of the substrate on the liquid crystal side that faces the backlight from among the substrates in the panel, is known. In the bottom gate type thin film transistor, the gate electrode is formed so as to be located on the substrate side rather than on the semiconductor layer side, so that light from the backlight that is emitted through the above described substrate can be blocked by the above described gate electrodes, because the characteristics change when the above described semiconductor layer is irradiated with light.

In recent years, thin film transistors having a two-layer structure, where a microcrystal silicon layer and an amorphous silicon layer are layered in sequence on the gate electrode side in the semiconductor layer, have come into use (see JP2005-167051A). The microcrystal silicon layer can be formed by carrying out heat treatment on an amorphous silicon layer. This thin film transistor has higher field effect mobility than thin film transistors where the semiconductor layer is formed only of an amorphous silicon layer. In addition, the so-called S value (swing factor), which is one of the initial properties, can be made small, and effects can be gained such that chronological fluctuation in the threshold value voltage can be kept small.

SUMMARY OF THE INVENTION

However, in the thin film transistor in JP2005-167051A, the gate electrodes cannot completely shield the microcrystal silicon layer from light. In addition, there is a disadvantage, such that the off current increases, even in the above described configuration where light from the backlight is blocked by the gate electrodes. Here, the off current is a current that flows between the source and the drain of a thin film transistor even in a state in which a control voltage for turning off the thin film transistor is being applied to the gate electrode.

The present inventors pursued the reasons for this and found out the following. First, in the case where the semiconductor layer in a thin film transistor has a multilayer structure of a microcrystal silicon layer and an amorphous silicon layer, the gate electrode of the thin film transistor is formed so as to be relatively thin. This is because a heating process for heating amorphous silicon is required when forming the above described microcrystal silicon, and the heat is prevented from being released through the above described gate electrode. If the heat that is applied for the formation of the above described microcrystal silicon is released, the amorphous silicon is not sufficiently converted to microcrystal. Therefore, the film thickness of the gate electrode is approximately 50 nm in the case where the gate electrode is formed of MoW, for example.

Meanwhile, they confirmed that the efficiency of photoelectric conversion within the semiconductor layer greatly increases in thin film transistors having this structure. This is because sufficient electron-hole pairs are generated when light enters the semiconductor layer and light of a long wavelength passes through the amorphous silicon layer, and at the same time sufficient electron-hole pairs are separated within the microscopic silicon layer, and the separated electrons are led to one electrode and the holes are led to the other electrode.

It is clear from the above that a light amount of the light from the backlight that passes through the substrate transmits through the gate electrodes of the thin film transistors and enters the semiconductor layers of the thin film transistors, and as a result of photoelectric conversion resulting from the above mechanism, an off current flows through the thin film transistors. Here, in the case where the gate electrode is formed of MoW, for example, and has a film thickness of approximately 50 nm, the light transmittance of the gate electrode is approximately 1%.

An object of the present invention is to provide a display device having thin film transistors where an off current can be prevented from being generated due to the reduced irradiation with light even with an extremely simple structure.

In the display device according to the present invention, the film thickness of the gate electrode of the thin film transistors is relatively high, so that the effects of shielding the gate electrode from light increase and an off current can be prevented from being generated.

The structure of the present invention is as follows, for example.

(1) The display device according to the present invention is a display device where thin film transistors are formed on a substrate on which an image display portion is formed, wherein the above described thin film transistors comprise: a gate electrode; a gate insulating film formed so as to cover the above described gate electrode; a semiconductor layer in island form which is formed on the above described gate insulating film so as to overlap with the above described gate electrode; and a pair of electrodes formed on the above described semiconductor layer so as to face each other, and the above described semiconductor layer is provided within a region where the above described gate electrode is formed as viewed in a plane, and formed of a crystal semiconductor layer and an amorphous semiconductor layer, which are layered in sequence on the above described gate electrode side, characterized in that the above described gate electrode is formed so as to have such a film thickness that the light transmittance is 0.3% or less at least in the region facing the above described semiconductor layer.

(2) The display device according to (2) of the present invention is the display device according to (1), characterized in that the above described crystal semiconductor layer is a microcrystal semiconductor layer.

(3) The display device according to (3) of the present invention is the display device according to (1), characterized in that the above described crystal semiconductor layer is a polycrystal semiconductor layer.

(4) The display device according to (4) of the present invention is the display device according to (1), characterized in that the thickness of the above described gate electrode in the region facing the above described semiconductor layer is greater than the thickness in the region other than the region that faces the above described semiconductor layer.

(5) The display device according to (5) of the present invention is the display device according to (1), characterized in that the above described crystal semiconductor layer has a surface on the side opposite to the above described gate insulating film and a sidewall surface which crosses the above described surface, and the above described surface and the above described sidewall surface are covered with the above described amorphous semiconductor layer.

(6) The display device according to (6) of the present invention is the display device according to (1), characterized in that the above described gate electrode is formed of an MoW alloy, the above described crystal semiconductor layer is formed of microcrystal silicon, and the above described amorphous semiconductor layer is formed of amorphous silicon, and the above described film thickness of the above described gate electrode is 75 nm or more and 150 nm or less.

(7) The display device according to (7) of the present invention is the display device according to (1), characterized in that the above described tin film transistors are formed within pixels that form an image display portion.

(8) The display device according to (8) of the present invention is the display device according to (1), characterized in that the above described thin film transistors are formed within a circuit around the periphery of the image display portion.

(9) The display device according to (9) of the present invention is the display device according to (1), characterized in that the display device is a liquid crystal display device.

(10) The display device according to (10) of the present invention is the display device according to (1), characterized in that the display device is an organic EL display device.

Here, the above described structures are merely examples, and various modifications are possible for the present invention, as long as they do not depart from the technical idea thereof. In addition, examples of the structure of the present invention other than those described above will become clearer from the description throughout the present specification and the drawings.

In the above described display device, thin film transistors having high field effect mobility, where the amount of light with which the semiconductor layer is irradiated can be reduced and an off current can be prevented from being generated can be provided, even with an extremely simple structure.

Other effects of the present invention will become clearer from the description throughout the specification.

DESCRIPTION OF THE PREFERED EMBODIMENTS

Figure 1:
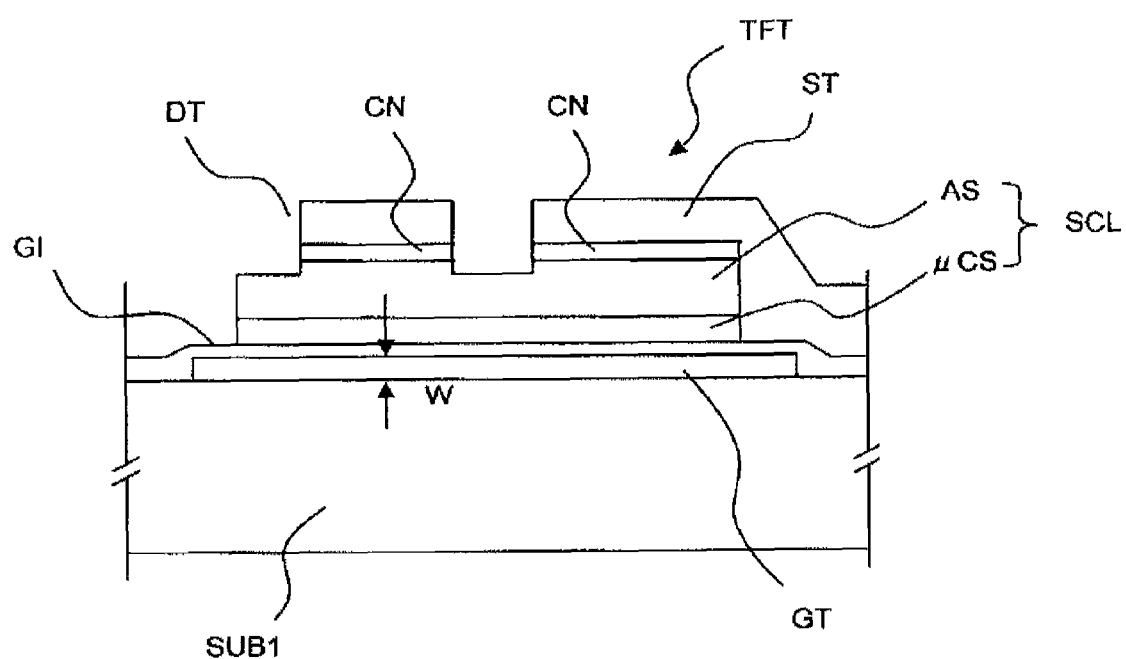
FIG. 1 is a cross sectional diagram showing a thin film transistor that is provided in the display device according to the first embodiment of the present invention.

The embodiments of the present invention are described in reference to the drawings. Here, the same symbols are used for components that are the same or similar in the drawings and embodiments, and descriptions that are the same are not repeated.

[First Embodiment]

(Entire Configuration)

Figure 2:
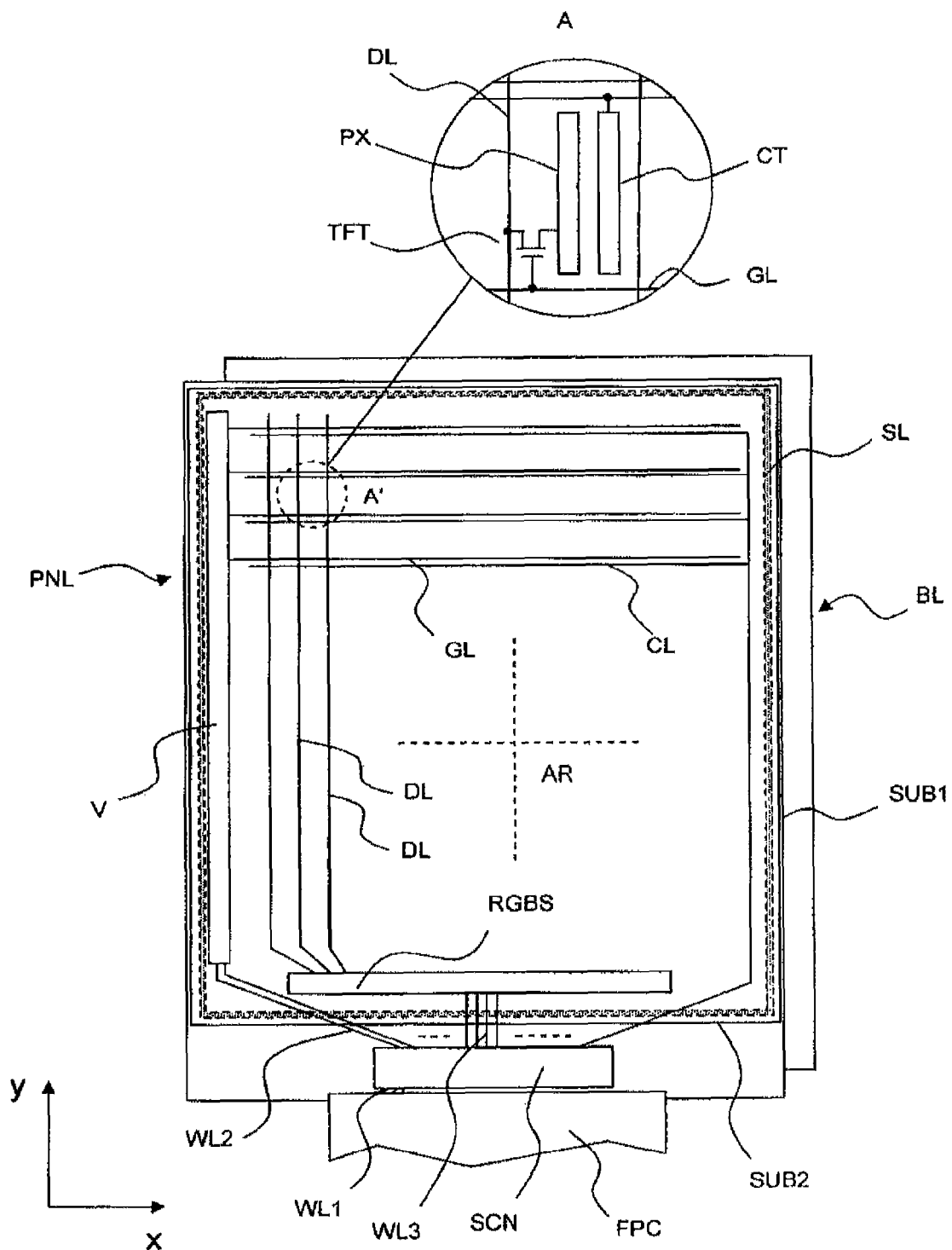
FIG. 2 is a plan diagram schematically showing the display device according to the first embodiment of the present invention.

FIG. 2 is a plan diagram showing a liquid crystal display device which is an example of the display device according to the first embodiment of the present invention.

The liquid crystal display device in FIG. 2 is formed of a liquid crystal display panel PNL that is provided on the viewer side and a backlight BL that is provided on the rear of this liquid crystal display panel PNL.

The housing of the liquid crystal display panel PNL is formed of rectangular substrates SUB1 and SUB2 made of glass, for example. Liquid crystal (not shown) is sandwiched between the substrates SUB1 and SUB2, and this liquid crystal is sealed in by means of a sealing material SL for securing the substrates SUB1 and SUB2 together. The region within which the liquid crystal is sealed in by means of the sealing material SL forms an image display region AR. In this image display region AR, a number of pixels are aligned in a matrix.

The lower side portion of the above described substrate SUB1 has a portion that is exposed from the substrate SUB2, and this portion is connected to one end of a flexible substrate FPC into which a signal is inputted from the outside. In addition, a semiconductor device SCN made of a chip is mounted in the region between the flexible substrate FPC and the substrate SUB2 on the above described substrate SUB1. Signals from the above described flexible substrate FPC are inputted into the semiconductor device SCN via wires WL1 formed on the substrate SUB1.

In addition, a scan signal driving circuit V is formed in the image display region AR on the left in the figure, in the region between the sealing material SL and the above described image display region AR, and an RGB switching circuit RGBS is formed on the bottom in the figure. Signals are supplied to the scan signal driving circuit V and the RGB switching circuit RGBS from the above described semiconductor device SCN via the wires WL2 and WL3 formed on the substrate SUB1, respectively. The scan signal driving circuit V is a circuit for supplying a scan signal to the below described number of gate signal lines GL in sequence, while the RGB switching circuit RGBS is a circuit for switching the video signal supplied to the below described number of drain signal lines DL chronologically between red, green and blue.

Here, the above described scan signal driving circuit V and RGB switching circuit RGBS are circuits formed on the substrate SUB1 at the same time as the pixels within the image display region AR and formed of a number of thin film transistors (not shown).

Gate signal lines GL, drain signal lines DL and common signal lines CL are formed in the image display region AR. The above described gate signal lines GL run in the direction x in the figure and are aligned in the direction y, and the left end thereof is connected to the above described scan signal driving circuit V. The above described drain signal lines DL run in the direction y in the figure and are aligned in the direction x, and the bottom end thereof is connected to the above described RGB switching circuit RGBS. The above described common signal lines CL are formed between adjacent gate signal lines GL so as to be parallel to the gate signal lines GL, and connected at one end (for example the right end, as in the figure), so that a reference signal (signal that becomes a reference for a video signal) can be supplied from the above described semiconductor device SCN.

Regions surrounded by adjacent gate signal lines GL and adjacent drain signal lines DL correspond to pixel regions (within the dotted circle A' in the figure, for example) as shown in the enlargement in the solid circle A in the figure, pixels are formed of a thin film transistor TFT which is turned on by a scan signal from a gate signal line GL, a pixel electrode PX to which a video signal is supplied from a drain signal line DL via the thin film transistor TFT when turned on, and a counter electrode CT to which a reference signal is supplied through the connection to the above described common signal line CL. An electrical field having a component parallel to the surface of the substrate SUB1 is generated between the pixel electrodes PX and the counter electrodes CT, and the electrical field drives liquid crystal molecules. This liquid crystal display device is known to be able to provide so-called wide view angle display, and also referred to as IPS type or lateral electrical field type, because of the particularity in the application of an electrical field to the liquid crystal. However, the present invention is not limited to lateral electrical field type, but can be applied to liquid crystal display devices referred to as vertical electrical field type.

The backlight BL is formed so as to have a surface light source that faces at least the image display region AR of the liquid crystal display panel PNL. This backlight BL is formed of a light guide plate that is provided so as to be parallel to the liquid crystal display panel PNL and a light source that is provided on the sidewall surface along one side of the light guide plate, for example. A cold cathode ray tube or light emitting diodes is used for the light source. Light from the light source enters the light guide plate and is repeatedly reflected within the light guide plate, and then emitted through the surface of the light guide plate facing the liquid crystal display panel PNL.

(Configuration of Pixels)

Figure 3A:
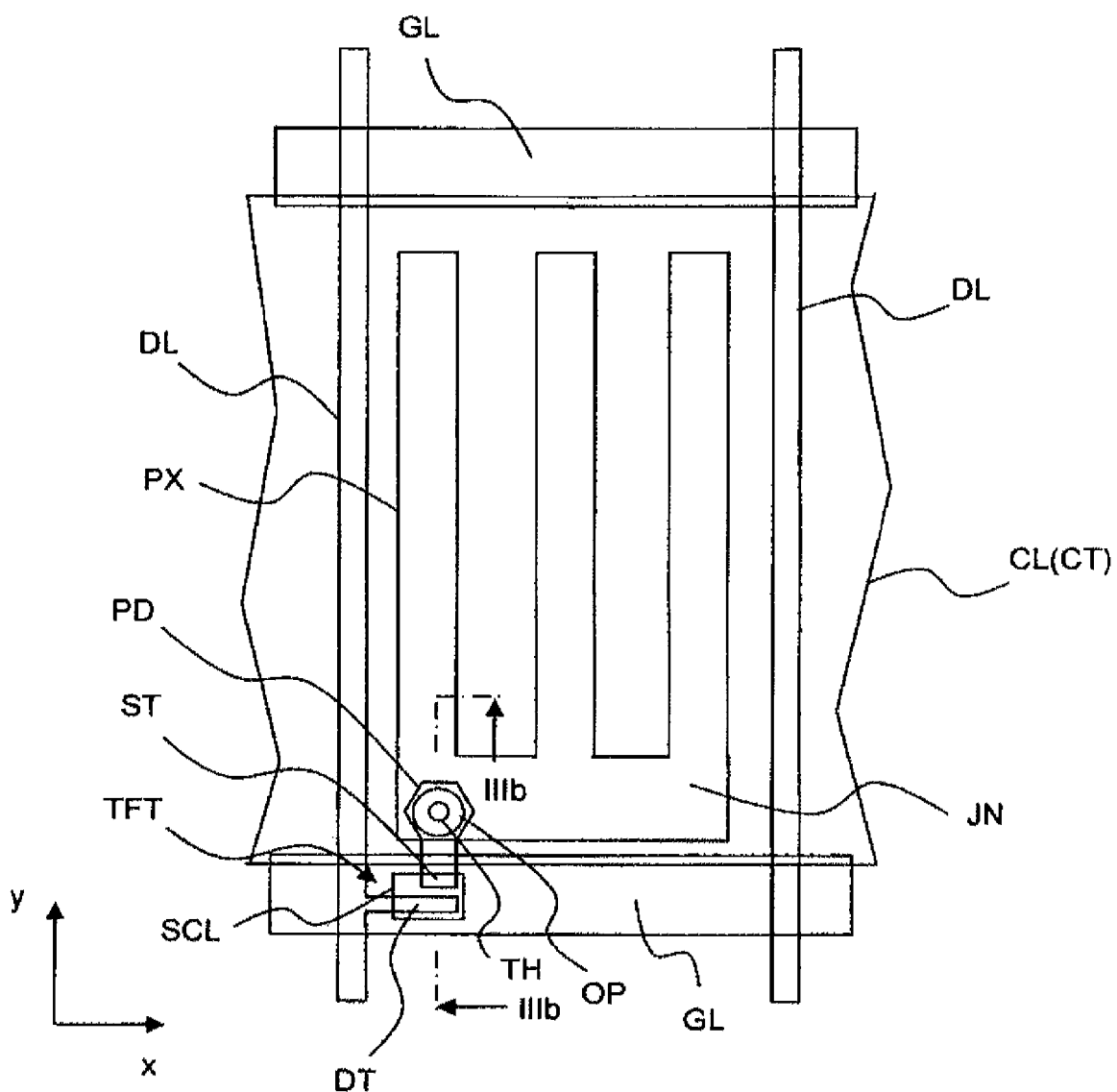
FIGS. 3A and 3B are diagrams showing the structure of a pixel in the display device according to the first embodiment of the present invention.
Figure 3B:
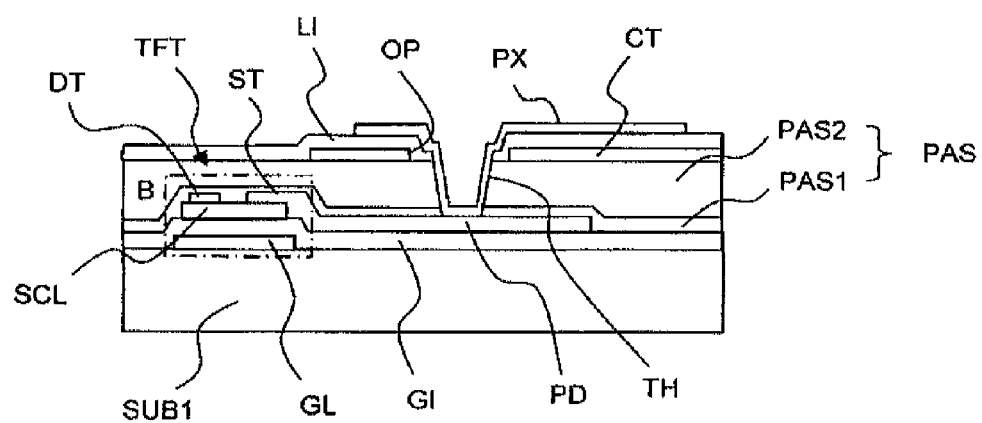

FIGS. 3A and 3B are diagrams showing the configuration of pixels formed on the surface of the substrate SUB 1 on the liquid crystal side, and show the structure in the portion in the solid circle A in FIG. 2. FIG. 3A is a plan diagram, and FIG. 3B is a cross sectional diagram along line in FIG. 3A.

First, gate signal lines GL which run in the direction x in the figure and are aligned in the direction y are formed on the surface of the substrate SUB1 on the liquid crystal side. An insulating film GI is formed on the surface of the substrate SUB1 so as to cover the gate signal lines GL, and this insulating film GI functions as a gate insulating film in the below described region where thin film transistors TFT are formed.

A semiconductor layer SCL is formed in island form on the surface of the gate insulating film GI and in the region where thin film transistors TFT are formed so as to overlap with part of the gate signal lines GL. The above described thin film transistors TFT are MIS (metal insulator semiconductor) type transistors having a so-called bottom gate structure where a drain electrode DT and a source electrode ST are formed so as to face each other on the surface of the above described semiconductor layer SCL, so that part of the gate signal line GL can be used as the gate electrode. The structure of this thin film transistor TFT is described in detail below.

Drain signal lines DL which run in the direction y in the figure and are aligned in the direction x are formed on the surface of the above described substrate SUB1, and part of these drain signal lines extend over the surface of the above described semiconductor layer SCL, and this part works as the drain electrode DT for the thin film transistors TFT. In addition, when the drain signal lines DL are formed, source electrodes ST of the thin film transistors TFT are formed, and these source electrodes ST are formed so as to have a pad portion PD that extends to the pixel region side over the region where the semiconductor layer SCL is formed. This pad portion PD is formed as a portion that is electrically connected to the below described pixel electrode PX.

A passivation film PAS is formed on the surface of the above described substrate SUB1 so as to cover the drain signal lines DL. This passivation film PAS is made of a film for preventing the thin film transistors TFT from making direct contact with the liquid crystal, and formed of a multilayer structure having a passivation film PAS1 made of an inorganic insulating film and a passivation film PAS2 made of an organic insulating film. An inorganic insulating film is used for the protective film PAS2 in order to gain such effects that the surface of the protective film is flattened, for example.

Common signal lines CL are formed between adjacent gate signal lines GL on the surface of the insulating film PAS so as to run in the same direction as the gate signal lines GL. These common signal lines CL are formed so as to almost entirely cover the pixel regions, aligned in the direction x in the figure, and also work as counter electrodes CT in the pixel regions. These common signal lines CL (counter electrodes CT) are formed of a transparent, conductive film made of ITO (indium tin oxide), for example.

An insulating film LI is formed of an inorganic insulating film on the surface of the substrate SUB1 so as to cover the common signal lines CL (counter electrodes CT), and pixel electrodes PX are formed on the upper surface of this insulating film LI in the respective pixel regions. The insulating film LI functions as an interlayer insulating film between the pixel electrodes PX and the below described counter electrodes CT. The pixel electrodes PX are formed of a number of straight electrodes (three for example, as in the figure) which run in the direction y in the figure and are aligned in the direction x, and these electrodes have a connection portion JN for mutual connection in the end portion on the above described thin film transistor TFT side. The pixel electrodes PX are formed of a transparent, conductive film made of ITO (indium tin oxide), for example. Part of the connection portion JN of the pixel electrodes PX are electrically connected to the pad portion PD of the above described source electrode ST via through holes TH created in the interlayer insulating film LI and the insulating film PAS. In addition, in this case, an opening OP having a much larger diameter than the through hole TH which is approximately coaxial with the above described through hole TH is created in advance in the common signal line CL (counter electrode CT), so that the above described pixel electrode TX can be prevented from being electrically connected to the counter electrode CT.

(Structure of Thin Film Transistors)

FIG. 1 is a cross sectional diagram showing the structure of the above described tin film transistor TFT in detail, and an enlargement of the area inside the dotted box B in FIG. 3B.

In FIG. 1, a gate electrode GT is formed on the surface of a substrate SUB1. This gate electrode GT corresponds to part of the region of a gate signal line GL and is formed of a conductive film of a metal, such as MoW, Ti or Al, together with the gate signal line GL.

The above described gate electrode GT (also the gate signal line GL in the case of the first embodiment) is formed so that the thickness W has a predetermined value or higher. The thickness W of the gate electrode GT in this case is different depending on whether the material is MoW, Ti or Al, for example, and as a result is set so that the light transmittance is 0.3% or less. Thus, the structure allows the efficiency of the gate electrode GT in blocking light to increase. In the case where the gate electrode GT is made of MoW, for example, the film thickness thereof is approximately 50 nm (the light transmittance is 1% in this case) according to the prior art, in order to prevent the heat applied for the formation of a microcrystal semiconductor layer μCS from being released through the gate electrode GT, but the thickness is set greater than this value in the case of the present embodiment.

The gate electrode GT has such a size as to stick out from the region where the below described semiconductor layer SCL is formed as viewed in a plane. This is because the gate electrode GT functions to block light from the backlight BL (bottom in the figure). An insulating film GI is formed on the surface of the substrate SUB1 so as to cover the gate electrode GT, and this insulating film GI functions as a gate insulating film. A semiconductor layer SCL is formed in island form on the upper surface of the insulating film GI. This semiconductor layer SCL is formed so as to overlap with the above described gate electrode GT and not to protrude from the above described gate electrode GT as viewed in a plane. In addition, this semiconductor layer SCL is formed of a microcrystal semiconductor layer μCS made of microcrystal silicon and an amorphous semiconductor layer AS made of amorphous silicon, for example, which are layered on the gate electrode GT side in sequence.

A drain electrode DT and a source electrode ST are formed on the surface of the semiconductor layer SCL. The drain electrode DT and the source electrode ST are provided on the semiconductor layer SCL so as to face each other and extend outside the region where the semiconductor layer SCL is formed along the sidewall surface of the semiconductor layer SCL. The drain electrode DT is connected to a drain signal line DL and the source electrode ST is connected to a pad portion PD, as described above. In addition, a contact layer CN where the amorphous semiconductor layer AS is doped with an n type impurity with a high concentration is formed on the surface of the semiconductor layer SCL in the interface with the drain electrode DT and in the interface with the source electrode ST. The above described contact layer CN is formed by forming a high concentration impurity layer on the upper surface of the semiconductor layer SCL when the semiconductor layer SCL is formed, and using the drain electrode DT and the source electrode ST as a mask after the drain electrode DT and the source electrode ST are formed and patterned, so that the above described high concentration impurity layer exposed from the mask can be etched. In this case, in order to prevent electrical connection between the drain electrode DT and the source electrode ST due to residue of the high concentration impurity layer, the surface of the semiconductor layer SCL that is exposed from the drain electrode DT and the source electrode ST is etched deeper than the interface with the contact layer CN.

In the thus formed thin film transistor TFT, the semiconductor layer SCL is formed of a multilayer body of a microcrystal semiconductor layer μCS and an amorphous semiconductor layer AS, and therefore, the efficiency of photoelectric conversion is high in the structure. That is to say, sufficient electron-hole pairs are generated when light enters the semiconductor layer SCL and light of a long wavelength passes through the amorphous semiconductor layer AS, and at the same time, sufficient electron-hole pairs are separated in the microcrystal semiconductor layer μCS, so that the separated electrons are led to one electrode and the holes are led to the other electrode.

However, even when a semiconductor layer SCL having high efficiency in photoelectric conversion is used as described above, the gate electrode GT is formed so as to have such a film thickness that the light transmittance is 0.3% or less, as described above, and therefore, light from the backlight BL that enters through the substrate SUB1 is almost completely blocked by the above described gate electrode GT, and thus, the above described disadvantage with photoelectric conversion can be avoided.

Figure 4:
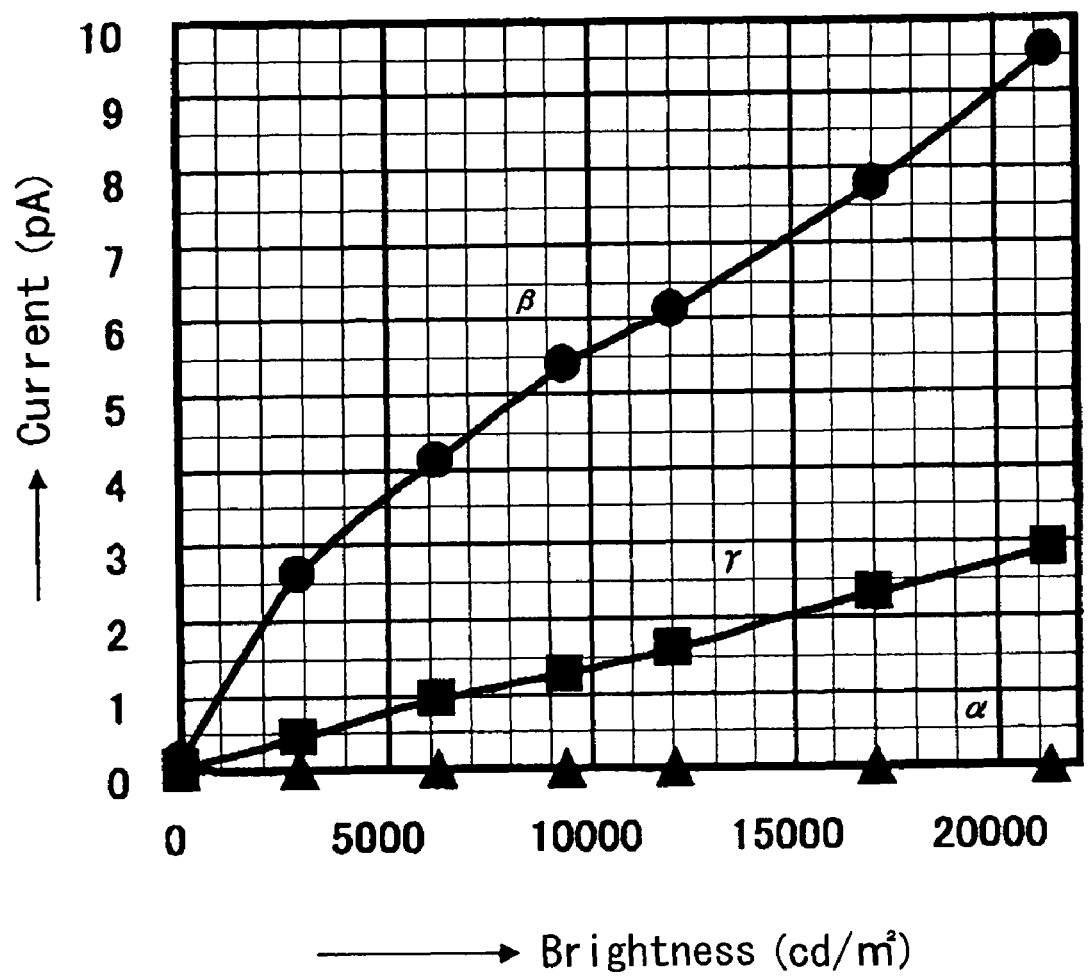
FIG. 4 is a graph showing the off current characteristics of the thin film transistors provided in the display device according to the first embodiment of the present invention.

FIG. 4 is a graph showing the off current characteristics in the case where the gate electrode GT is made of MoW and has a film thickness of 100 nm in a thin film transistor TFT having the above described structure. In the graph, the lateral axis is the brightness (cd/m2) of the backlight BL and the longitudinal axis is the off current (pA).

In FIG. 4, the curve a is the off current characteristics of the thin film transistor TFT having the above described structure in the case where the gate electrode GT is made of MoW and has a film thickness of 100 nm. For the sake of comparison, the curve 6 is the off current characteristics of a tin film transistor TFT having the above described structure in the case where the gate electrode GT is made of MoW and has a film thickness of 50 nm. Furthermore, in FIG. 4, the curve y is the off current characteristics of a thin film transistor having polysilicon that can be formed at a low temperature (LTPS) as a semiconductor layer, where the gate electrode GT is made of MoW and has a film thickness of 50 nm.

As is clear from FIG. 4, the gate electrode GT has sufficient light blocking properties in the thin film transistor TFT according to the first embodiment, so that the off current can be kept at approximately 0 (pA) even when the brightness of the backlight BL reaches 20,000 (cd/m2).

As described above, in the case where the gate electrode GT has such a film thickness that the light transmittance is 0.3% or less, the off current can be greatly reduced, while in the case where the film thickness of the gate electrode GT is too high, the semiconductor layer cannot be sufficiently converted to microcrystal, due to the absorption of heat by the gate electrode GT when the microcrystal semiconductor layer is formed. Therefore, in the case where the gate electrode GT is made of MoW and the semiconductor layer is formed of a microcrystal silicon layer and an amorphous silicon layer, it is desirable for the film thickness of the gate electrode GT to be 75 nm or more and 150 nm or less.

[Second Embodiment]

Figure 5:
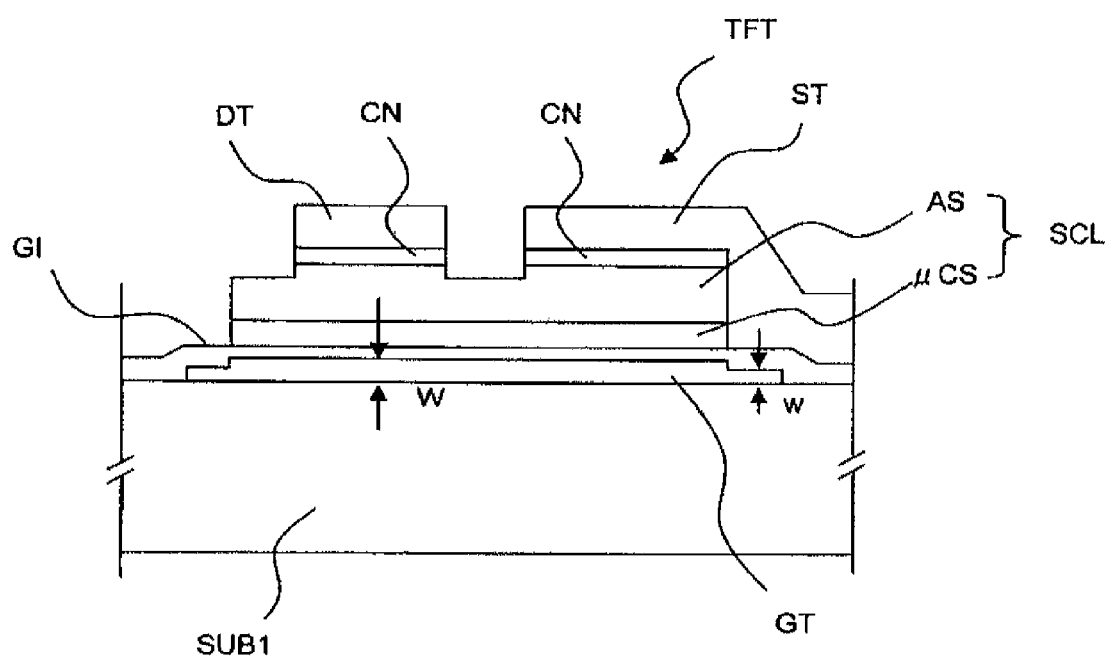
FIG. 5 is a cross sectional diagram showing a thin film transistor provided in the display device according to the second embodiment of the present invention.

FIG. 5 is a diagram showing the structure of the display device according to the second embodiment of the present invention, and corresponds to FIG. 1.

The structure in FIG. 5 is different from that in FIG. 1 in that the gate electrode GT is formed so as to have such a film thickness W that the light transmittance is 0.3% or less in the region facing at least the semiconductor layer SCL (microcrystal semiconductor layer μCS, amorphous semiconductor layer AS), and other regions, including the gate signal lines DL, are formed so as to have a film thickness w that is smaller than the film thickness W. The object of the present invention can be achieved by preventing the semiconductor layer SCL from being irradiated with light, and therefore, only a minimal region in the gate electrode GT has a sufficient light blocking function.

It is clear from the above that the gate electrode GT may have a two-layer structure, so that the same structure as in FIG. 5 can be gained.

[Third Embodiment]

Figure 6:
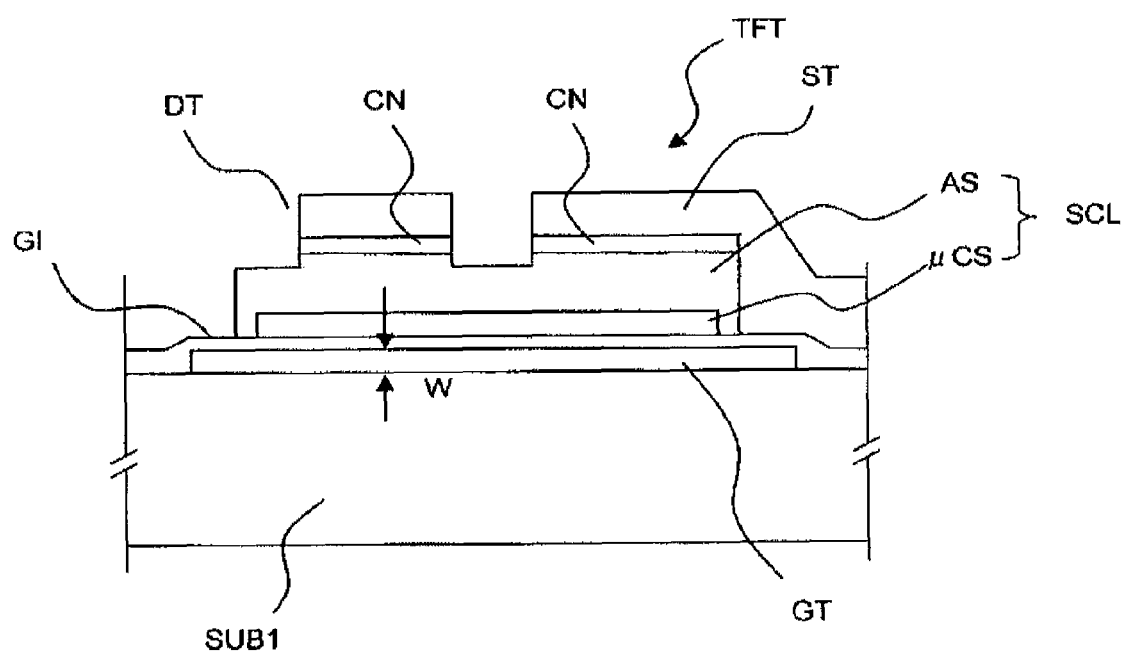
FIG. 6 is a cross sectional diagram showing a thin film transistor provided in the display device according to the third embodiment of the present invention.

FIG. 6 is a diagram showing the structure of the display device according to the third embodiment of the present invention, and corresponds to FIG. 1.

The structure in FIG. 6 is different from that in FIG. 1 in that the microcrystal semiconductor layer μCS has a relatively small area in the semiconductor layer SCL having a multilayer body of a microcrystal semiconductor layer μCS and an amorphous semiconductor layer AS, and the amorphous semiconductor layer AS protrudes outside the microcrystal semiconductor layer μCS. This structure prevents the drain electrode DT and the source electrode ST from making direct contact with the microcrystal semiconductor layer μCS.

In this case also, the gate electrode GT has such a size as to protrude from the region where the semiconductor layer SCL (amorphous semiconductor layer AS) is formed as viewed in a plane. This is in order for the gate electrode T to function to block light from the backlight BL.

[Fourth Embodiment]

In the above described embodiments, the semiconductor layer SCL in the thin film transistors TFT is formed as a multilayer body of a microcrystal semiconductor layer μCS and an amorphous semiconductor layer AS. However, a polycrystal semiconductor layer, such as of polysilicon, is used instead of the microcrystal semiconductor layer μCS, for example, and thus there is the same problem as described above. Therefore, the semiconductor layer SCL in the thin film transistors TFT may be a multilayer body of a polycrystal semiconductor layer and an amorphous semiconductor layer AS. Here, in this specification, the microcrystal semiconductor layer and the polycrystal semiconductor layer may be referred to as crystal semiconductor layer.

[Fifth Embodiment]

In the above described embodiments, the thin film transistor TFT in FIG. 1 is formed in each pixel in the image display portion AR.

As shown in FIG. 2, however, the scan signal driving circuit V formed on the substrate SUB1 is provided with a number of thin film transistors, which may have the structure shown in FIG. 1. Accordingly, the present invention can be applied to thin film transistors in the scan signal driving circuit V.

Likewise, the RGB switching circuit RGBS formed on the substrate SUB1 is also provided with a number of thin film transistors, which may have the structure shown in FIG. 1. Accordingly, the present invention can be applied to thin film transistors in the RGB switching circuit RGBS.

It is clear from the above that the present invention can be applied for thin film transistors formed on the substrate where the display portion is formed, in addition to the above described scan signal drive circuit V and RGB switching circuit RGBS. In short, the present invention can be applied to thin film transistors that form circuits around the periphery of the image display portion AR.

[Sixth Embodiment]

In the above described embodiments, examples of liquid crystal display devices are described. However, the present invention can be applied to other display devices, for example organic EL display devices. This is because thin film transistors are formed on the substrate in organic EL display devices also.

Though the present invention is described on the basis of the above embodiments, the structures in these embodiments are merely examples, and the present invention can be modified in various ways, as long as the technological idea is not deviated from. In addition, the structures described in the respective embodiments may be combined for use, as long as they are compatible.

What is claimed is:

1. A display device where thin film transistors are formed on a substrate on which an image display portion is formed, wherein
said thin film transistors comprise:
a gate electrode;
a gate insulating film formed so as to cover said gate electrode;
a semiconductor layer in island form which is formed on said gate insulating film so as to overlap with said gate electrode; and
a pair of electrodes formed on said semiconductor layer so as to face each other, and
said semiconductor layer is provided within a region where said gate electrode is formed as viewed in a plane, and formed of a crystal semiconductor layer and an amorphous semiconductor layer, which are layered in sequence on said gate electrode side, characterized in that
said gate electrode is formed so as to have such a film thickness that a light transmittance is 0.3% or less at least in a region facing said semiconductor layer.

2. The display device according to claim 1, characterized in that said crystal semiconductor layer is a microcrystal semiconductor layer.

3. The display device according to claim 1, characterized in that said crystal semiconductor layer is a polycrystal semiconductor layer.

4. The display device according to claim 1, characterized in that the thickness of said gate electrode in the region facing said semiconductor layer is greater than the thickness in a region other than the region that faces said semiconductor layer.

5. The display device according to claim 1, characterized in that
said crystal semiconductor layer has a surface on a side opposite to said gate insulating film and a sidewall surface which crosses said surface, and
said surface and said sidewall surface are covered with said amorphous semiconductor layer.

6. The display device according to claim 1, characterized in that
said gate electrode is formed of an MoW alloy, said crystal semiconductor layer is formed of microcrystal silicon, and said amorphous semiconductor layer is formed of amorphous silicon, and said film thickness of said gate electrode is 75 nm or more and 150 nm or less.

7. The display device according to claim 1, characterized in that said thin film transistors are formed within pixels that form the image display portion.

8. The display device according to claim 1, characterized in that said thin film transistors are formed within a circuit around a periphery of the image display portion.

9. The display device according to claim 1, characterized in that the display device is a liquid crystal display device.

10. The display device according to claim 1, characterized in that the display device is an organic EL display device.

* * * * *